(12) United States Patent　　(10) Patent No.: US 6,320,885 B1
Kawai et al.　　(45) Date of Patent: Nov. 20, 2001

(54) UPCONVERSION FIBER LASER APPARATUS

(75) Inventors: Kiyoyuki Kawai, Yokosuka; Ritsuo Yoshida, Zushi; Ken Itou, Yamato; Hideaki Okano, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/389,378

(22) Filed: Sep. 3, 1999

(51) Int. Cl.$^7$ ............................. H01S 3/30; H01S 3/091
(52) U.S. Cl. ..................................... 372/6; 372/75
(58) Field of Search .................. 372/6, 40, 41, 372/70, 71, 75, 21, 5

(56) References Cited

U.S. PATENT DOCUMENTS 5,226,049　7/1993　Grubb ........................................ 372/6

FOREIGN PATENT DOCUMENTS 197 18 997 A1　11/1998　(DE) .
0 450 677 A1　10/1991　(EP) .
0 762 570 A2　3/1997　(EP) .

OTHER PUBLICATIONS

J.Y. Allain, M. Monerie, H. Poignant, "Blue Upconversion Fluorozirconate Fibre Laser," Electronics Letters, Feb. 1, 1990, vol. 26, No. 3, pp. 166–168.

E.W.J.L. Oomen and E.J. Lous, "A Material And Device Study For Obtaining A Blue Upconversion Fiber Laser," Philips Journal of Research, 1992, vol. 46, No. 4–5, pp. 157–196. (no month available).

*Primary Examiner*—Quyen Leung
(74) *Attorney, Agent, or Firm*—Pillsbury Winthrop LLP

(57) ABSTRACT

In an up-conversion laser using Tm, blue light having a wavelength of 450 nm and blue light having a wavelength of 480 nm are outputted simultaneously. A high output is enabled with a high efficiency, and a green up-conversion laser is also realized by a similar means. A hybrid fiber laser apparatus includes a light source which outputs light near a wavelength A, and comprises a means for reflecting light near the wavelength A, which is provided at another end of the optical fiber, thereby to form an optical resonator for the wavelength A. In this hybrid fiber laser apparatus, an up-conversion fiber is provided in the optical resonator for the wavelength A, and optical resonator structures for a wavelength B constructed by reflection means and for a wavelength B are respectively provided at two positions at both ends of the up-conversion fiber. Of the two reflection means, the reflection means in the laser diode chip side is arranged so as to achieve high reflection, and the other reflection means in the other end side is arranged so as to achieve partial reflection, thereby to obtain output light having a wavelength B from the partial reflection side.

10 Claims, 3 Drawing Sheets

UPCONVERSION FIBER LASER APPARATUS

BACKGROUND OF THE INVENTION

The present invention relates to an upconversion fiber laser apparatus for use in displays, optical storage apparatuses, methods of processing light information, and the like.

J. Y. Allain, et al., "Blue Upconversion Fluoroziroconate Fiber Laser" Electron Lett. 26, 1990, 166 discloses the following.

When a $Tm^{3+}$ ion is pumped with two red light beams having wavelengths of 674.4 nm and 647.1 nm, respectively, it emits two light beams having wavelengths of 455 nm and 480 nm, respectively. This mechanism is called an upconversion laser. The output light of 455 nm is a pulse-like beam, whereas the output light of 480 nm is a spike-like beam. They are not continuous waves (CWs).

E. W. J. Oomen, et al., "A Material and Device Study for Obtaining A Blue Upconversion Fiber Laser" Philips J. Res. 46, 157–198, 1992 discloses an analysis of the lights the $Tm^{3+}$ ion emitted, and presents FIGS. 2A and 2B.

FIG. 2A shows the energy levels a $Tm^{3+}$ ion takes, illustrating the energy transition the undergoes when pumped with light having wavelength of 650 nm. In FIG. 2A, the upward pointing arrows 101, 103, and 105 indicate absorptive transition (the ion absorbs light, thus acquiring energy). The downward pointing arrows 104 and 106 indicate radiative transition (the ion emits light, thus losing energy). The downward pointing, wavy line arrow 102 indicates non-radiative decay. The base level $^3H_6$ and the other levels $^3H_4$, $^3H_5$, $^{3F}_4$, $^3F_{2,3}$, $^1G_4$, and $^1D_2$ shall be called "level 1," "level 2," "level 3," "level 4," "level 5," "level 6," "level 7" and "level 8," respectively.

Energy exchange takes place between levels when the $Tm^{3+}$ ion is pumped with light having wavelength of 650 nm. More specifically, as the $Tm^{3+}$ ion absorbs the pump light, its energy shifts from the base level 1 to level 5 or 6 (arrow 101). The ion stays at level 5 or 6, but for an extremely short time. It undergoes non-radiative decay; its energy decreases to level 4 (arrow 102). The ion absorbs pump light once again, undergoing absorptive transition and, thus, shifting from level 4 to level 8 (arrow 103). The ion then transits from level 8 to level 2 (arrow 104). This transition is an radiative one, radiating blue light of 450 nm. The $Tm^{3+}$ ion absorbs the pump light, transiting from level 2 to level 7 (arrow 105). The ion then undergoes radiative transition, from level 7 to the base level 1 (arrow 106). In the course of this radiative transition, the light of 480 nm is emitted.

FIG. 2B shows the results of the analysis of the light the $Tm^{3+}$ ion emitted when pumped with light of 650 nm. In FIG. 2B, the population distribution at various energy levels is plotted on the ordinate, and the optical power P (W) is plotted on the abscissa. The light emitted from the thulium (Tm) ion must be continuous waves (CWs) if it is to be used in displays. In view of the physical properties of thulium, however, it is considered extremely difficult for Tm to emit CWs at wavelength of 450 nm, though Tm can emit CWs at wavelength of 480 nm.

BRIEF SUMMARY OF THE INVENTION

Accordingly, the first object of the present invention is to provide a means that enables an upconversion laser using Tm to emit two blue light beams having wavelengths of 450 nm and 480 nm simultaneously, both in the form of continuous waves.

The second object of the invention is to provide a similar means that realizes a blue-light upconversion laser.

To achieve the above objects, the present invention provides a hybrid fiber laser apparatus in which a super luminescence diode (SLD) chip (or laser diode chip) and an optical fiber are connected with each other at a low reflection rate, and a means for reflecting light near a wavelength A is provided at each of the other end of the laser diode chip and the other end of the optical fiber, thereby to form an optical resonator for the wavelength A. In this hybrid laser apparatus, an up-conversion fiber is provided in the optical resonator for the wavelength A, and an optical resonator structure for a wavelength B, which is constructed by a reflection means for the wavelength B, is provided at each of two positions respectively at both ends of the up-conversion fiber. Of the reflection means at the two positions, the reflection means in the laser diode chip side is arranged so as to have a high reflection rate, and the other end side is arranged to achieve partial reflection, so that output light having the wavelength B is obtained from the partial reflection side. By obtaining the resonance structure for the wavelength B described above, it is possible to extract light of a desired color.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described, with reference to the accompanying drawings.

Figure 1A:
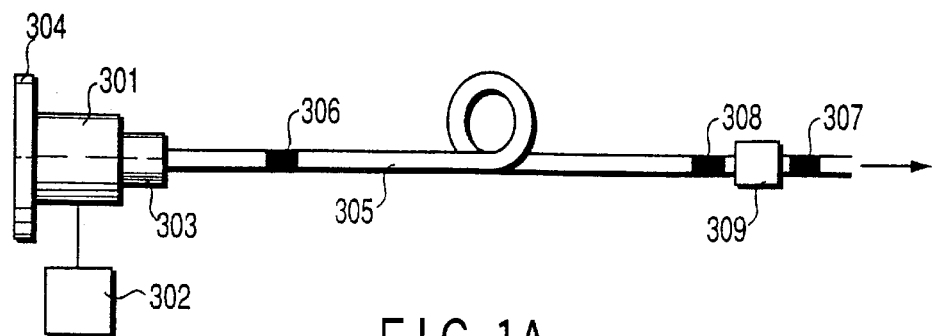
FIG. 1A is a diagram showing the first embodiment of the present invention.
Figure 1B:
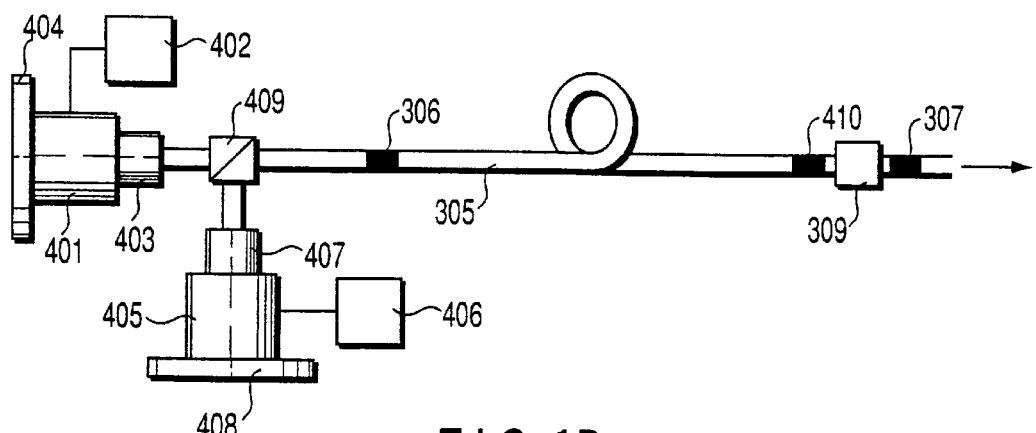
FIG. 1B is a diagram depicting the second embodiment of this invention.

FIGS. 1A and 1B show the first and second embodiments of the invention, respectively. Before describing these embodiments, the principle of the invention will be explained, with reference to FIG. 2B.

Figure 2A:
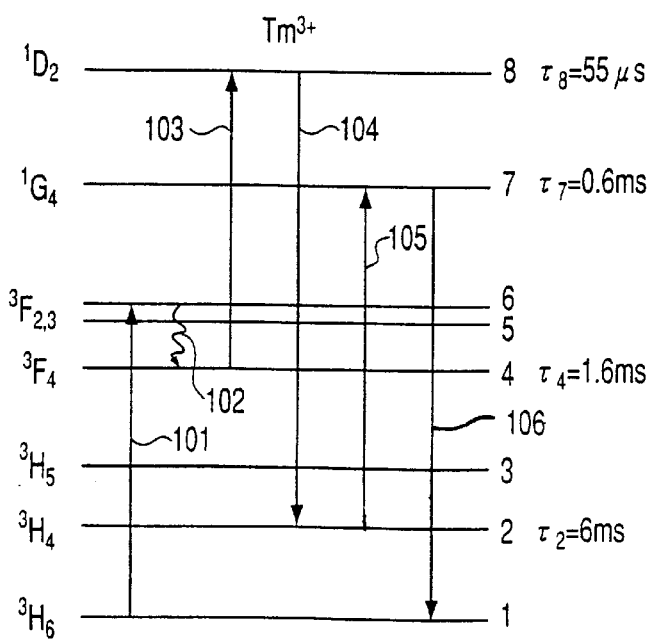
FIG. 2A is a diagram illustrating the energy transition which an $Tm^{3+}$ ion undergoes when pumped with pump light having wavelength of 650 nm.
Figure 2B:
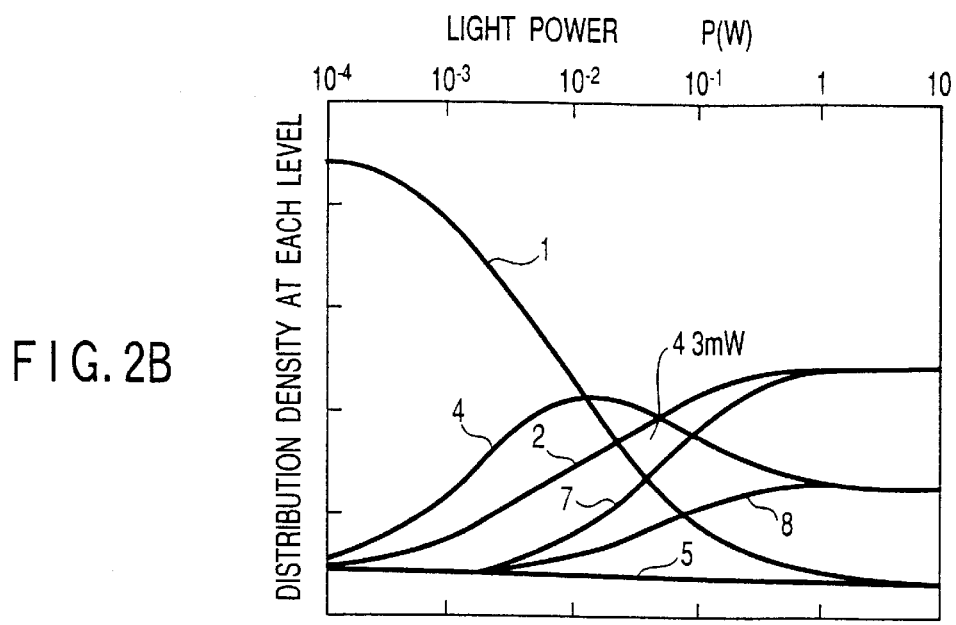
FIG. 2B is a graph showing the population distribution at various levels that is observed when an $Tm^{3+}$ ion is pumped with the light of 650 nm.

As mentioned above, FIG. 2B is a graph in which the population distribution at various energy levels and the optical power P (W), which were observed when an $Tm^{3+}$ ion is pumped with the light of 650 nm, are plotted on the ordinate and abscissa, respectively. A close study of FIG. 2B shows that the population distribution at level 7 rises above the population distribution at the base level 1 as the optical power P increases. So-called "inversion" takes place. This means that light of 480 nm can be output in the form of continuous waves (CWs). In other words, the radiative transition (arrow 106) shown in FIG. 2A can continue.

FIG. 2B also shows that the population distribution at level 8 never rises above the distribution density of electrons at the base level 2 as the optical power P increases. Light of 450 nm cannot be output in the form of continuous waves (CWs). This is because any electron at level 8 has a lifetime of 55 μs, which is far shorter than the lifetime (6 ms) of the electrons staying at level 2.

A display light source must emit red light having a wavelength ranging from 610 nm to 630 nm, green light having a wavelength ranging from 510 nm to 530 nm, and blue light having a wavelength ranging from 460 nm to 470 nm, and must provide output power in the order of watt or more. There is some wavelength tolerance for red light and green light. Tolerance is very small for blue light, however. The blue light will become bluish purple if its wavelength is modified shorter wavelength side, and will hardly be perceived as blue if its wavelength is modified longer wavelength side than proper wavelength.

Gallium nitride-based laser diodes are known as blue-emitting lasers. They can hardly find use in displays at present, because their output and reliability are insufficient.

By contrast, thulium (Tm) can output a light beam of 450 nm and a light beam of 480 nm at the same time. Thulium can therefore be used in displays as a light source that emits light beams having wavelengths ranging from 460 nm to 470 nm.

In view of its physical properties, Tm can output light having wavelength of 480 nm in the form or continuous waves (Cws) and may, therefore, be used in displays. Due to the above-mentioned relation between level 8 and level 2, however, it is extremely difficult for Tm to emit light of 450 nm in the form of continuous waves (CWs).

As seen from FIG. 2B, the optical power P is large in, for example, a region near 2W. In this region, the population distribution at level 7 is higher than that of level 1, creating inversion. At optical power P of 43 mW or more, level 7 is inverted with respect to level 1. Assume that the $Tm^{3+}$ ion is forced by external means into induced emission (i.e., radiative transition indicated by arrow 106). In this case, the energy of the $Tm^{3+}$ ion decreases from level 7 to the base level 1 as shown in FIG. 2A, emitting light having wavelength of 480 nm. As a result of this induced emission, the population distribution at level 7 decreases, whereas the population distribution at the base level 1 increases.

Since the $Tm^{3+}$ ion is sufficiently pumped with light having wavelength of 650 nm, it efficiently absorbs the pump light as the population distribution at level 7 decreases. The absorptive transition (arrow 105) from level 2 to level 7 is thereby achieved effectively, decreasing the population distribution at level 2.

The increase in the population distribution at the base level 1 is accompanied by absorptive transition (arrow 101) from the base level 1 to level 5 and then to level 6. The electrons stays at levels 5 and 6 for a very short time; its energy level quickly transits to level 4 (arrow 102). The population distribution at level 4 therefore increases.

When the population distribution at level 2 decreases due to the increase in the population distribution at level 4, a path is provided for energy transition from level 4 to level 8 and, hence to level 2. That is to say, while sufficiently pumped with light of 650 nm, the $Tm^{3+}$ ion, the $Tm^{3+}$ ion absorbs light and transits from level 4 to level 8 (arrow 103), whereby the population distribution at level 8 increases.

In the process described above, the population distribution at level 2 decreases, and the population distribution at level increases, surpassing that of the electrons at level 2. Inversion occurs between level 2 and level 8. This inversion makes the $Tm^{3+}$ ion transit from level 8 to level 2 (arrow 104), thus emitting light having wavelength of 450 nm. This emission of light having wavelength of 450 nm increases the population distribution at level 2. The population distribution at level 2 settles to a specific value when the system becomes balanced. At the same time, the population distribution at any other energy level settles to a specific value, too.

In summary, the $Tm^{3+}$ ion is sufficiently pumped with light, then made to transit from level 7 to base level 1, thus emitting light having wavelength of 480 nm, and further made to undergo active absorptive transition (arrow 105) from level 2 to level 7. This decreases the population distribution at level 2 and increases the population distribution at level 8. The $Tm^{3+}$ ion can, therefore, emits two light beams having wavelengths of 480 nm and 450 nm, respectively, at the same time. (The light beam of 450 nm is emitted by virtue of induced emission, i.e., radiative transition (arrow 104).)

(First Embodiment)

The first embodiment of the invention, which is based on the principle described above, will now be described in detail with reference to FIG. 1A. As shown in FIG. 1A, an pump light source 301 is provided. The light source 301 comprises a laser diode chip (or an SLD (Super-Luminescent Diode)) that outputs pump light having an intermediate wavelength of about 650 nm. A drive device 302 is connected to the light source 301 to drive the light source 301. The drive device 302 comprises a power-supply circuit system.

A coupling element 303, a mirror 304, an optical fiber 305, mirrors 306 and 307, and a fiber grating (mirror) 308 are provided. The optical fiber 305 is made of material having low phonon energy, such as fluoride-based material or the like. The core of the fiber 305 dopes $Tm^{3+}$ ions. The coupling element 303 is composed of a wave guide, which connects the pump light source 301 and the optical fiber 305. The mirror 304 is an optical member for reflecting the pump light emitted from one end of the light source 301. The optical member is, for example, a multi-layer dielectric film formed on that end of the pump light source 301. This member exhibits a reflectance of 99% or more to pump light having wavelength of about 650 nm. The fiber grating (mirror) 308 is in the optical fiber 305. The grating 308 has a refractive index which cyclically varies so that it may exhibit a reflectance of 99% or more to pump light having wavelength of about 650 nm. That is, the grating 308 is a mirror which is a part of the optical fiber and whose refractive index varies with respect to wavelengths.

The mirrors 306 and 307 have a grating cycle gradually varied in the lengthwise direction to reflect light beams of wavelengths over a broad band. The mirror 306 and 307 can reflect both a light beam having wavelength of 450 nm and a light beam having wavelength of 480 nm. The mirror 306 has a reflectance of 99% or more to both light beams (i.e., 450 nm-beam and 480 nm-beam). The mirror 307 has a different reflectance, or partial reflecting property, to both light beams (i.e., 450 nm-beam and 480 nm-beam).

A polarizing element 309 is provided in the optical fiber 305. The element 309 is, for example, an optical member that is set in a slit made in the optical fiber 305.

How the first embodiment of the invention operates will be explained, with reference to FIG. 1A.

First, the pump light source 301 emits pump light from both ends. The mirror 304 reflects the pump light emitted from the rear end of the light source 301, which applied back to the light source 301. The light is amplified while passing through the light source 301. The light thus amplified is applied to the optical fiber 305 via the coupling element 303. The mirror 308 reflects the pump light, which is applied again to the pump light source 301. The light is further amplified while passing through the pump light source 301. That is, a resonator is provided between the mirrors 304 and 308. The resonator maintains the pump light (having wavelength of 650 nm) at high density in the optical fiber 305. The pump light is absorbed into the $Tm^{3+}$ ions doped to the optical fiber 305.

As has been described in conjunction with principle of the invention, the $Tm^{3+}$ ions can emit two light beams having wavelengths of 450 nm and 480 nm, respectively, at the same time if the pump light remains at high density. The mirrors 306 and 307 constitute a resonator for these light beams. The mirror 306 that has high reflectance reflects the light beam having wavelength of 450 emitted from the $Tm^{3+}$ ions. The mirror 307 reflects part of the light having wavelength emitted from the $Tm^{3+}$ ions. The polarizing element 309 is provided in the optical fiber 305. The resonator exhibits a great Q value to light polarized in a particular direction. The polarized light vigorously excites the light beams. These beams are repeatedly reflected and amplified in the resonator, generating a laser beam. Parts of these beams pass through the mirror 307 and simultaneously emitted from the end of the optical fiber, as two light beams that have wavelengths of 450 nm and 480 nm, respectively.

As described above, in the present invention, energy control in the fiber is performed by a resonator. Further, resonators are respectively constructed for a plurality of wavelengths, and light having such a wavelength that is necessary for pump is enclosed in the fiber while other light having an unnecessary wavelength is extracted therefrom. That is, in this embodiment, a first resonator acts with respect to a light beam having a wavelength of 650 nm and a second resonator acts with respect to light beams having wavelengths of 450 nm and 480 nm. Further, the light beams having wavelengths of 450 nm and 480 nm are extracted.

In the next embodiment which will now be explained below, various modified measures for energy control will be understood clearly.

In the embodiment described above, the mirrors in the optical fiber 305 is not limited to the positional relationship according to the present embodiment, but the same operation as described above can be attained if the positional relationship between the mirrors 307 and 308 is reversed.

Also, the positional relationship of the polarizing element 309 is not limited to that according to the present embodiment as long as the element 309 is situated in the resonator constructed by the mirrors 306 and 307.

Also, the mirror 307 partially reflects both the light of 450 nm and light of 480 nm. This mirror 307, however, may consist of two mirrors each having a narrow band range, which respectively have partial reflection rates with respect to the wavelengths of 450 nm and 480 nm.

Also, the pump light source device 301 may be a light source capable of oscillating with high light density, such as a laser diode. In this case, the mirror 304 is not required.

Also, the mirrors in the optical fiber 305 may be mirrors each having a narrow band range and using a dielectric multi-layered film made of, which are provided at both ends of the optical fiber 305.

Also, as the optical fiber 305, it is possible to use a polarization preservation fiber which has an asymmetrical cross-sectional shape.

Also, the polarizing element 309 is not a component essential to the present invention but may be omitted unless constantly polarized light is required as the output light. This also applies to the embodiments described later.

It has been reported that there is an up-conversion laser which is capable of obtaining an output with a wavelength of 545 nm when $Ho^{3+}$ ions are pumped by pump light near the wavelength of 645 nm. In the same structure as the embodiment described above, a green up-conversion fiber laser apparatus with a high efficiency can be constructed if the reflection center wavelength of the mirror 308 is set to a wavelength near 645 nm and the reflection wavelengths of the mirrors 306 and 307 are set to wavelengths near 545 nm, with use of an optical fiber 305 doped with $Ho^{3+}$ ions in place of $Tm^{3+}$ ions and with use of a light source device which generates pump light near the wavelength of 645 nm in place of the light source 301.

It is also reported that an output with a wavelength of 545 nm can be obtained when $Er^{3+}$ ions are pumped by light with a wavelength near 970 nm or 800 nm. In the same structure as the embodiment 1 described above, a green up-conversion fiber laser apparatus with a high efficiency can be constructed if the reflection center wavelength of the mirror 308 is set to a wavelength near 970 nm or 800 nm and the reflection wavelengths of the mirrors 306 and 307 are set to a wavelength near 545 nm, with use of an optical fiber 305 doped with $Er^{3+}$ ions in place of $Tm^{3+}$ ions and with use of a light source device which generates pump light near the wavelength of 970 nm in place of the light source 301.

(Second Embodiment)

As has been described above, three transitions (absorptive transition) 101, 103, and 105 in order to simultaneously oscillate light of both wavelengths of 450 nm and 480 nm in the up-conversion depending on $Tm^{3+}$ ions. The center wavelengths of absorbed spectrums of the transitions are as follows.

Center wavelength of absorbed spectrums of the pump transition
  (indicated by the arrow 101) . . . 676 nm
Center wavelength of absorbed spectrums of the pump transition
  (indicated by the arrow 103) . . . 647 nm
Center wavelength of absorbed spectrums of the pump transition
  (indicated by the arrow 105) . . . 640 nm As indicated above, the largest difference among the center wavelengths of the pump transitions is about 36 nm or so. Since each absorbed spectrum has a certain width, it is possible to absorb pump light of a wavelength of 650 nm thereby to make an pump transition as in the principle described above. However, if light having a wavelength close to the center wavelength is used as pump light in each pump transition, it is possible to efficiently absorb light and to make pump transitions.

FIG. 1B is a view showing the structure of an up-conversion fiber laser apparatus as a second embodiment of the present invention. In the present embodiment, description will be made only to differences from the first embodiment. Note that components which are same as those in the first embodiment will be denoted by same reference symbols and particular explanation thereof will be omitted herefrom.

In FIG. 1B, 401 denotes a first pump light source device which is constructed by a laser diode chip for emitting pump light having a center wavelength of 650 nm, for example. 402 denotes a drive device for driving the first pump light source 401 and is constructed by a power-source/circuit system. 403 denotes a coupling element which is constructed by a waveguide passage for connecting the pump light source 401 and the optical fiber 305 with each other. 404 denotes a mirror prepared at an end of the first pump light source 401 and is constructed so as to have a reflection rate of 99% or more with respect to light having a wavelength near 650 nm. 405 denotes a second pump light source which is constructed by a laser diode chip for emitting pump light having a center wavelength of 670 nm, for example. 406 denotes a drive device for driving the second pump light source 405 which is constructed by a power-source/circuit system. 407 denotes a coupling element which is constructed by a waveguide passage for connecting the pump light source 405 and the optical fiber 305 with each other. 408 denotes a mirror prepared at an end of the second pump light source 405 and is constructed so as to have a reflection rate of 99% or more with respect to light near a wavelength of 670 nm. 409 denotes a wavelength division multiplexers/demultiplexers and is constructed by a WDM coupler, for example. 410 denotes a mirror prepared in the optical fiber 305 which is constructed so as to have a reflection rate of 99% or more with respect to each of light having wavelengths near 650 nm and near 670 nm.

Next, operation of the second embodiment according to the present invention will be explained with reference to FIG. 1B.

At first, pump light is emitted from both ends of the first pump light source 401. First pump light emitted from the rear end surface of the pump light source 401 is reflected by a mirror 404 and is passed and amplified through the pump light source 401 again. First pump light emitted from the front end surface of the pump light source 401 is passed through the coupling element 403, enters into the optical fiber 305, and is further passed through the wavelength division multiplexers/demultiplexers 409. The pump light is reflected by the mirror 410, is passed through the wavelength division multiplexers/demultiplexers 409 again, and enters into the first pump light source 401. This pump light is passed through the first pump light source 401 and is thereby amplified.

That is, with respect to the first pump light, a resonator is formed between the mirror 404 and the mirror 410. Owing to this resonator structure, it is possible to maintain a high pump light density in the optical fiber 305.

Likewise, pump light is emitted from both ends of the second pump light source 405. Second pump light emitted from the rear end surface of the pump light source 405 is reflected by the mirror 408 and is passed again and amplified through the pump light source 405. Second pump light emitted from the front end surface of the pump light source 405 is passed through the coupling element 407 and enters into the optical fiber 305. This second pump light is synthesized with the first pump light by the wavelength division multiplexers/demultiplexers 407. The second pump light is reflected by the mirror 410 and is divided by the wavelength division multiplexers/demultiplexers 409. This pump light then enters into the second pump light source 405 again and is passed and amplified through this second pump light source 405.

That is, with respect to the second pump light, a resonator is formed between the mirror 408 and the mirror 410. Like the first pump like, a high pump density can be maintained in the optical fiber 305, owing to this resonator structure.

The first pump light and the second pump light are absorbed by $Tm^{3+}$ doped to the optical fiber 305, so the first pump light contributes mainly to the pump transitions (indicated by the arrows 103 and 105) shown previously in FIG. 2B while the second pump light contributes to the pump transition (indicated by the arrow 101).

As described above, by selecting a light source of a wavelength which is capable of activating the pump transitions for absorbing energy, operation of the apparatus according to the present invention can be achieved more effectively.

By the operation described above, it is possible to obtain simultaneously laser beams of wavelengths of 450 nm and 480 nm from the end of the optical fiber, like the first embodiment of the present invention.

Although the present embodiment is arranged such that the mirror 410 prepared in the optical fiber 305 has a reflection rate of 99% or more with respect to pump light having wavelengths near 650 nm and 670 nm, the mirror 410 may be constructed by two mirrors which have a similar reflection rate and which respectively have narrow band ranges corresponding to light of 650 nm and light of 670 nm.

Also likewise, each of the mirrors 306 and 307 may be constructed by two mirrors which respectively have narrow band ranges corresponding to light of 450 nm and light of 480 nm.

(Third Embodiment)

Figure 3A:
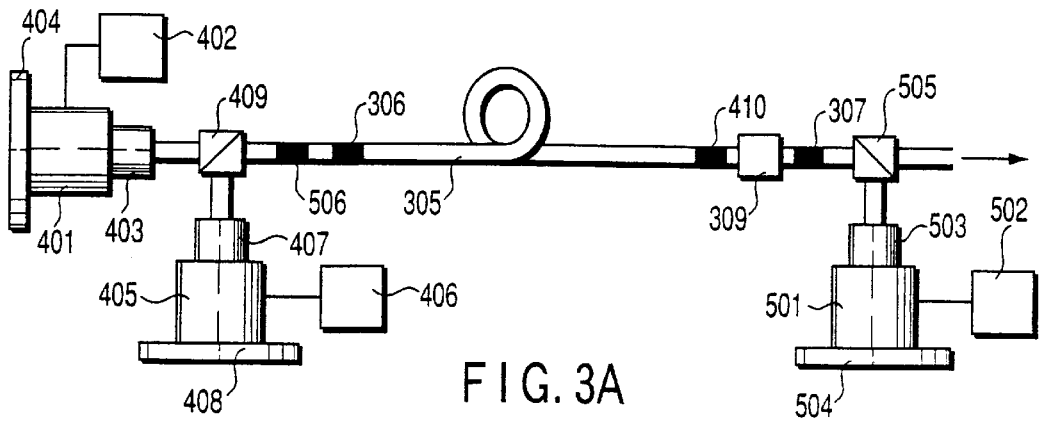
FIG. 3A is a diagram depicting an upconversion fiber laser according to the third embodiment of the invention.

FIG. 3A is a view showing the structure of an up-conversion fiber laser apparatus as a third embodiment of the present invention. In the present embodiment, description will be made only to differences from the first and second embodiments. Note that components which are same as those in the first embodiment will be denoted by same reference symbols and particular explanation thereof will be omitted herefrom.

In FIG. 3A, 501 denotes a third pump light source device which is constructed by a laser diode chip for emitting pump light having a center wavelength of 640 nm, for example. 502 denotes a drive device for driving the third pump light source 501 and is constructed by a power-source/circuit system. 503 denotes a coupling element which is constructed by a waveguide passage for connecting the pump light source 501 and the optical fiber 305 with each other. 504 denotes a mirror prepared at an end of the third pump light source 501 and is constructed so as to have a reflection rate of 99% or more with respect to light having a wavelength near 640 nm. 505 denotes a wavelength division multiplexers/demultiplexers and is constructed by a WDM coupler, for example. 506 denotes a mirror prepared in the optical fiber 305 which is constructed so as to have a reflection rate of 99% or more with respect to light having a wavelength near 640 nm.

Next, operation of the third embodiment according to the present invention will be explained with reference to FIG. 3A.

Pump light is emitted from both ends of the third pump light source 501. Third pump light emitted from the rear end surface of the pump light source 501 is reflected by a mirror 504 and is passed again and amplified through the pump light source 501. The third pump light emitted from the front end surface of the pump light source 501 enters into the optical fiber 305 through the coupling element 503. Next, the light is synthesized by the wavelength division multiplexers/demultiplexers 505. The pump light is reflected by the mirror 506 and also by the wavelength division multiplexers/demultiplexers 505. The light then enters into the third pump light source 501 and is passed and amplified through the third pump light source 501.

That is, with respect to the third pump light, a resonator is formed between the mirror 504 and the mirror 506. Owing to this resonator structure, it is possible to maintain a high pump light density in the optical fiber 305.

Like the second embodiment of the present invention, first and second pump light from the first and second pump light sources 401 and 405 and the third pump light are absorbed by $Tm^{3+}$ ions doped to the optical fiber 305, so the first pump light contributes mainly to the pump transitions (indicated by the arrow 103) previously described, the second pump light contributes to the pump transition (indicated by the arrow 101), and the third pump light contributes to the pump transition (indicated by the arrow 105).

As described above, by preparing three wavelengths for the pump light, it is possible to achieve absorption transitions with a higher efficiency, (which are transitions for storing light emission energy), so light emissions at wavelengths of 450 nm and 480 nm can be obtained simultaneously like in the first and second embodiments.

Also, in the structure of the first embodiment, if the mirror 308 is arranged so as to reflect light having wavelengths of 650 nm and 670 nm or light having wavelengths of 640 nm, 650 nm, and 670 nm and if the pump light source 301 is replaced with an pump light source device which oscillates at multiple wavelengths of 650 nm and 670 nm or 640 nm, 650 nm, and 670 nm by changing the cycle of the grating of a distributed feed back laser, the same advantages as the second and third embodiments can be obtained.

(Fourth Embodiment)

Prior to explanation of the fourth embodiment according to the present invention, basic principles of the present embodiment will be explained again with reference to FIGS. 2A and 3C. Explanation will be made only of differences from the first embodiment. FIGS. 3C and 2A differ from each other only in that another light emission transition (indicated by the arrow 701) appears in FIG. 3C.

Assume a state where the pump light density is very high in FIG. 2B, for example, a region of 2w. At this time, the distribution density at level 2 is larger than the distribution density at level 1, and inversion occurs therebetween. A transition from the level 2 to the level 1 is forcibly carried out.

This transition is a light emission transition (indicated by the arrow 701) in FIG. 3C. By this operation, light having a wavelength of 1800 nm and the distribution density at the level 2 decreases accordingly.

Then, the distribution density at the level 8 increases relatively in comparison with the distribution density at the level 2, and a light emission transition (indicated by the arrow 104) from the level 8 to the level 2 easily occurs, i.e., emission of light having a wavelength of 450 nm easily occurs.

Based on the principles described above, explanation will be made of the differences from the embodiment 1, with reference to the structure of the fourth embodiment according to the present invention.

Figure 3B:
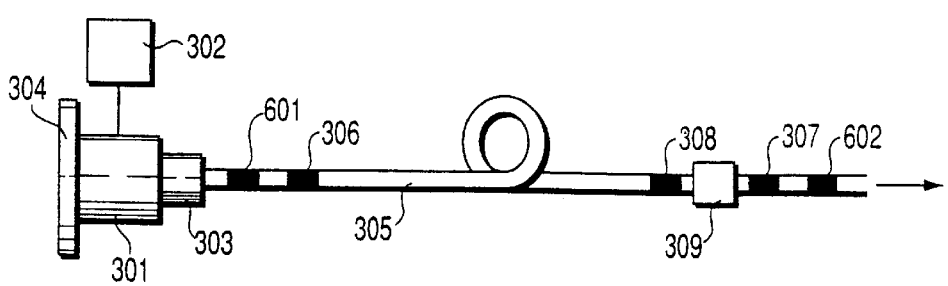
FIG. 3B is a diagram showing an upconversion fiber laser according to the fourth embodiment of the invention.
Figure 3C:
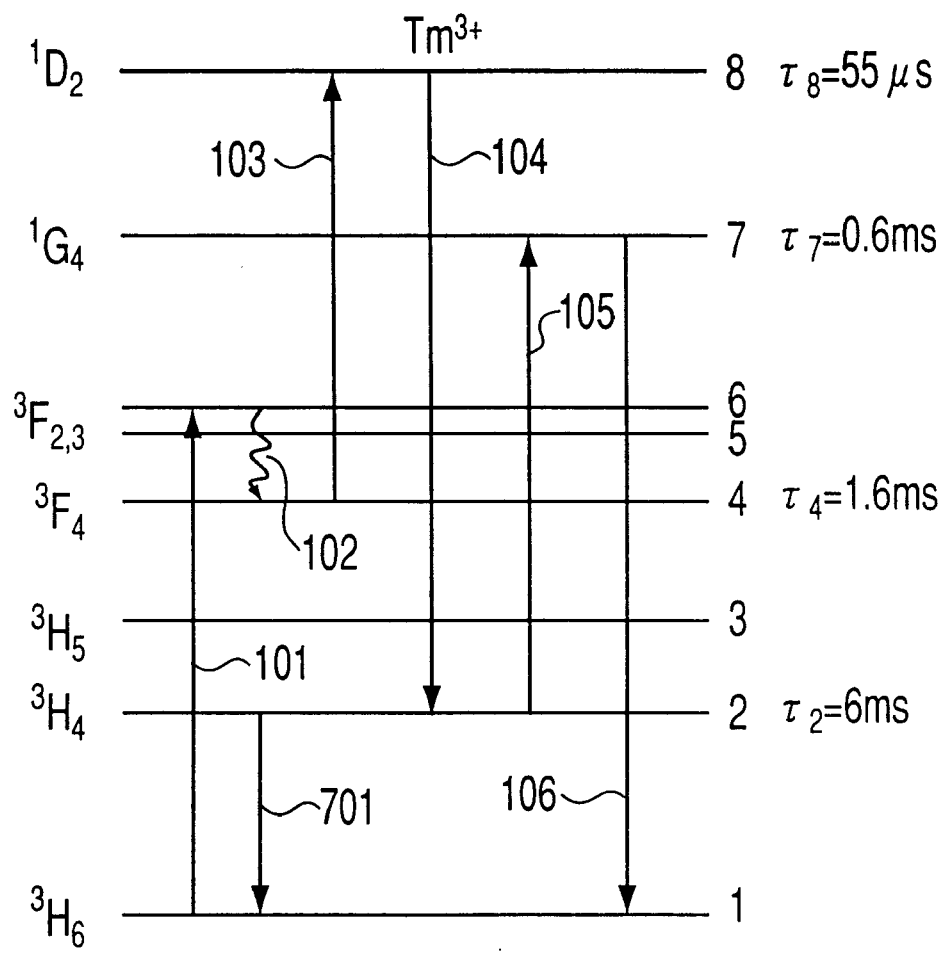
FIG. 3C is a diagram illustrating the population distribution at various levels that helps to realize the fourth embodiment of the invention.

In FIG. 3B, 601 and 602 denote mirrors prepared in the optical fiber 305 and reflect light having a wavelength near 1800 nm. These mirrors 601 and 602 form a resonator with respect to light having a wavelength near 1800 nm. Light having a wavelength of 1800 nm is generated by the resonator structure. Then, emission of light having a wavelength of 450 nm and light having a wavelength of 480 nm can be obtained easily.

The apparatus of the present invention, of course, can be used as a blue light source for a display, and is further applicable to various fields, such as a laser output apparatus for writing data onto a recording medium (or an optical disk), a laser output apparatus for reading data, and the like.

The features of the present invention described above will be summarized as follows. That is, in a hybrid fiber laser apparatus, a super luminescence diode (SLD) chip (or laser diode chip) which outputs light near a wavelength A and an optical fiber are connected with each other thereby achieving low reflection, and a means for reflecting light near the wavelength A is provided at each of the other end of the laser diode chip and the other end of the optical fiber, thereby forming a resonator for the wavelength A. In this hybrid fiber laser apparatus, an up-conversion fiber is provided in the optical resonator for the wavelength A, and an optical resonator structure for the wavelength B constructed by a reflection means is provided at each of two positions at both ends of the up-conversion fiber. Of the reflection means at the two positions, the reflection means in the laser diode chip side is arranged so as to attain a high reflection rate, and the other reflection means in the other end side is arranged so as to attain partial reflection, so output light having the wavelength B is obtained from the side of partial reflection.

In addition, the up-conversion fiber is an optical fiber doped with thulium (Tm) ions, and is constructed so as to reflect nearly 100% of red light having a wavelength near 650 nm, as a means for reflecting light having the wavelength A, and so as to reflect nearly 100% of light having wavelengths near 450 nm and 480 nm in the laser diode chip side and reflect partially light having wavelengths near 450 nm and 480 nm in the other end side, as a reflection means for light having the wavelength B. the reflection means for the wavelength B, the reflection means in the side opposite to the laser diode chip may be constructed so as to use different partial reflection rates thereof for a wavelength near 450 nm and for a wavelength near 480 nm, respectively. In addition, the reflection means for reflecting light near the wavelength A may be constructed so as to reflect selectively 100% of light of a plurality of wavelengths.

Also, the up-conversion fiber laser apparatus may be doped with a structure in which nearly 100% of red light near 650 nm and red light near 670 nm are reflected as the light of the plurality of wavelengths to be selected.

Also, the up-conversion fiber laser apparatus may be doped with a structure in which nearly 100% of red light near 640 nm, 650 nm, and 670 nm are reflected as the light of the plurality of wavelengths to be selected.

Also, the up-conversion fiber laser apparatus may further be doped with a structure which includes a reflection means for light having a wavelength near 1800 nm in addition to 450 nm and 480 nm and includes a resonator structure for a wavelength near 1800 nm. In addition, the second object is achieved by obtaining an up-conversion fiber laser apparatus as follows. That is, the up-conversion fiber laser apparatus is doped with a structure in which the up-conversion fiber is an optical fiber doped with holmium (Ho) ions, reflects nearly 100% of red light near 645 nm as a means for reflecting light near the wavelength A, and reflects nearly 100% of light near 545 nm in the laser diode chip side and partially reflects light near 545 nm in the other end side, as a reflection means for the wavelength B. Also, the second object is achieved by obtaining an up-conversion fiber laser apparatus as follows. That is, the up-conversion fiber laser apparatus is doped with a structure in which the up-conversion fiber is an optical fiber doped with erbium (Er) ions, reflects nearly 100% of red light near 970 nm or 800 nm as a means for reflecting light near the wavelength A, and reflects nearly 100% of light near 545 nm in the laser diode chip side and partially reflects light near 545 nm in the other end side, as a reflection means for the wavelength B.

As has been described above, according to the present invention, blue light of 450 nm and blue light of 480 nm are simultaneously outputted in an up-conversion laser using Tm, so a large output can be achieved with a high efficiency. It is also possible to realize a green up-conversion laser by a similar means.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An up-conversion fiber laser apparatus comprising:
   a first laser diode chip for outputting first light containing at least light having a wavelength A;
   an optical fiber having an end portion connected to a light output section of the first laser diode chip;
   a first resonator constructed by reflection means for reflecting the first light, which is provided in a reflecting side of the first laser diode chip, and a first mirror for reflecting the first light, which is provided in a side of another end portion of the optical fiber; and
   a second resonator constructed by a second mirror for reflecting second light containing at least light having a wavelength B, which is provided between the first laser diode chip and the first mirror, and a third mirror for partially reflecting the second light, which is formed in the side of the another end portion of the optical fiber.

2. An apparatus according to claim 1, wherein the optical fiber is an optical fiber doped with thulium (Tm) ions.

3. An apparatus according to claim 1, wherein
   the first light with which the first resonator resonates is red light having a wavelength including 650 nm,
   the second light with which the second resonator resonates is light having wavelengths including 450 nm and 480 nm, and
   output light having wavelengths including 450 nm and 480 nm is obtained.

4. An apparatus according to claim 3, wherein the third mirror partially reflects light having wavelengths including 450 nm and 480 nm, at different reflection rates for the wavelengths including 450 nm and 480 nm, respectively.

5. An apparatus according to claim 1, wherein
   a second laser diode chip for inputting light having a wavelength C is connected to the optical fiber, such that the first light contains at least light having the wavelength A and the wavelength C, and
   the optical fiber is provided with a second mirror for resonating with and reflecting the first light containing at least the light having the wavelength A and the wavelength C.

6. An apparatus according to claim 5, wherein the first light is red light having a wavelength including 650 nm and red light having a wavelength including 670 nm, and the second mirror reflects nearly 100% of the first light.

7. An apparatus according to claim 1, wherein
   the optical fiber is further provided with second and third laser diode chips for respectively inputting light having a wavelength C and light having a wavelength D, such that the first light contains at least light having the wavelengths A, C, and D,
   the optical fiber is provided with a second mirror for reflecting the light having the wavelengths A, C, and D, as the second mirror, and
   the first light is red light having wavelengths including 650 nm, 670 nm, and 640 nm, and the second mirror reflects nearly 99% of the first light.

8. An apparatus according to one of claims 1 to 7, wherein the second resonator has a function of resonance with light having a wavelength including 1800 nm in addition to a function of resonance with light having wavelengths including 450 nm and 480 nm.

9. An apparatus according to claim 1, wherein
   the up-conversion fiber is an optical fiber doped with holmium (Ho) ions,
   the first resonator resonates with red light having a wavelength including 645 nm,
   the second resonator has a function of resonance so as to reflect nearly 100% of light having a wavelength including 545 nm in a side of the laser diode chip and so as to partially reflect light having a wavelength including 545 nm in another end side, and
   output light having a wavelength including 545 nm is obtained as output light.

10. An apparatus according to claim 1,
    the up-conversion fiber is an optical fiber doped with Erbium (Ho) ions,
    the first resonator resonates with red light having a wavelength near 970 nm or 800 nm,
    the second resonator has a function of resonance so as to reflect nearly 100% of light having a wavelength including 545 nm in a side of the laser diode chip and so as to partially reflect light having a wavelength including 545 nm in another end side, and
    output light having a wavelength including 545 nm is obtained as output light.

* * * * *